(12) United States Patent
An

(10) Patent No.: US 7,977,164 B2
(45) Date of Patent: Jul. 12, 2011

(54) FUSE OF A SEMICONDUCTOR MEMORY DEVICE AND REPAIR PROCESS FOR THE SAME

(75) Inventor: Jun Kwon An, Icheon-shi (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 372 days.

(21) Appl. No.: 12/172,903

(22) Filed: Jul. 14, 2008

(65) Prior Publication Data

US 2008/0273411 A1    Nov. 6, 2008

Related U.S. Application Data

(62) Division of application No. 10/905,630, filed on Jan. 13, 2005, now abandoned.

(30) Foreign Application Priority Data

Jun. 22, 2004 (KR) .................. 2004-46761

(51) Int. Cl.
*H01L 21/82* (2006.01)

(52) U.S. Cl. ........ 438/132; 438/215; 438/601; 257/209; 257/E23.149; 257/E23.15

(58) Field of Classification Search .................. 257/209, 257/528, 529, 665, E23.146, E23.149, E23.15; 438/132, 215, 281, 333, 601

See application file for complete search history.

(56) References Cited

U.S. PATENT DOCUMENTS

| | | | |
|---|---|---|---|
| 4,162,538 A | 7/1979 | Thornburg | |
| 4,198,744 A | 4/1980 | Nicolay | |
| 5,903,041 A * | 5/1999 | La Fleur et al. | 257/530 |
| 6,121,073 A | 9/2000 | Huang et al. | |
| 6,225,652 B1 | 5/2001 | Devanney | |
| 6,307,213 B1 | 10/2001 | Huang et al. | |
| 6,713,837 B1 * | 3/2004 | Mori et al. | 257/529 |
| 7,067,897 B2 * | 6/2006 | Hatano et al. | 257/529 |
| 2002/0100956 A1 | 8/2002 | Brintzinger et al. | |
| 2003/0062590 A1 | 4/2003 | Anthony | |
| 2003/0095451 A1 | 5/2003 | Bang et al. | 365/200 |
| 2003/0164532 A1 | 9/2003 | Liu et al. | 257/529 |
| 2004/0058256 A1 | 3/2004 | Fujisawa et al. | 430/30 |
| 2005/0167728 A1 | 8/2005 | Kothandaraman et al. | |
| 2006/0138588 A1 | 6/2006 | Hell | |

* cited by examiner

*Primary Examiner* — Matthew E Warren

(57) ABSTRACT

Disclosed herein is a fuse of a semiconductor memory device and a repair process for the same. The fuse includes a lower conductive film of a multilayer interconnection formed on a lower structure of a semiconductor substrate, an upper conductive film of the multilayer interconnection spaced apart upward from the lower conductive film to define a predetermined vertical space therebetween, and a contact electrode, which vertically connects the upper and lower conductive films to each other and forms a fuse body. The lower conductive film includes a form not coinciding with that of the upper conductive film. With such a configuration, the device can achieve a stable minimization in the length of the fuse and the distance between adjacent fuses in consideration of a laser beam irradiation region for the high integration of the semiconductor memory device. In this way, the device performs the repair process of cutting the contact electrode and/or upper conductive film using a laser beam.

3 Claims, 7 Drawing Sheets

FUSE OF A SEMICONDUCTOR MEMORY DEVICE AND REPAIR PROCESS FOR THE SAME

CROSS REFERENCE TO RELATED APPLICATIONS

This application is a divisional of U.S. patent application Ser. No. 10/905,630 entitled "Fuse of a Semiconductor Memory Device and Repair Process for the Same," filed Jan. 13, 2005, the contents of which are expressly incorporated by reference herein.

FIELD OF TECHNOLOGY

In Dynamic Random Access Memory (DRAM), the most widely used memory device, some memory cells included in a manufactured DRAM chip tend to show partial malfunction. Therefore, through a repair process, these defective memory cells are replaced with redundant cells, which are previously prepared in the course of manufacturing the chip, so as not to have any negative effects upon operation of the resulting chip. In conclusion, use of the repair process contributes to an increased chip yield.

In the repair process, a program for selecting respective defective memory cells and replacing an address signal corresponding to the defective memory cell with an address signal of the redundant cell is performed in an internal circuit. Thereby, if an address signal corresponding to a line of the defective memory cell is input, the selected line of the defective memory cell is replaced with a line of the redundant cell. In order to realize the program, a laser beam has conventionally been used to cut a fuse. Here, the fuse is an interconnection to be cut by the laser beam, and the region occupied by the fuse is referred to as a fuse box.

The fuse is mainly made of polysilicon, and is formed simultaneously with the formation of word lines of a first polysilicon layer or bit lines of a second polysilicon layer, rather than being formed through an additional process. Recently, according to an increase in an integration density and processing speed of semiconductor memory devices, the fuse is now increasingly being made of metal, instead of the polysilicon.

FIG. 1 is a layout illustrating conventional fuses included in a semiconductor memory device. Referring to FIG. 1, a respective one of the fuses 12 takes the form of a single-layered conductive line (made of polysilicon or metal), and, as stated above, is formed simultaneously with the formation of the word lines, bit lines, or metal interconnections. In this case, if the width of the fuse 12 is 0.8 micrometers, the distance between adjacent fuses 12 must be doubled to 1.6 micrometers in order to ensure stability in the fuse repair process using the laser beam.

However, in the fuses of the conventional semiconductor memory device, as a result of horizontally arranging a plurality of the fuses, in the form of single-layered conductive lines, on a semiconductor substrate, it is necessary to reduce the distance between the fuses 12 as the integration density of the semiconductor memory device increases. Such a reduction in the distance between the fuses 12, however, correspondingly decreases a laser beam irradiation area, resulting in the risk of cutting unintended fuses by the laser beam.

SUMMARY

In one aspect, the invention is directed to a fuse of a semiconductor memory device which may include a lower conductive film of a multilayer interconnection formed on a lower structure of a semiconductor substrate, an upper conductive film of the multilayer interconnection spaced apart upward from the lower conductive film to define a predetermined vertical space there between, and a contact electrode, which vertically connects the upper and lower conductive films to each other and forms a fuse body, wherein the lower conductive film has a form not coinciding with that of the upper conductive film.

In another aspect, the invention is directed to a repair process for a fuse of a semiconductor memory device, the fuse comprising a lower conductive film of a multilayer interconnection formed on a lower structure of a semiconductor substrate, an upper conductive film of the multilayer interconnection spaced apart upward from the lower conductive film to define a predetermined vertical space therebetween, and a contact electrode vertically connecting the upper and lower conductive films to each other and forming a fuse body, comprising: cutting one or more of the following using a laser beam: the contact electrode or the upper conductive film of the fuse.

DETAILED DESCRIPTION

Figure 1:
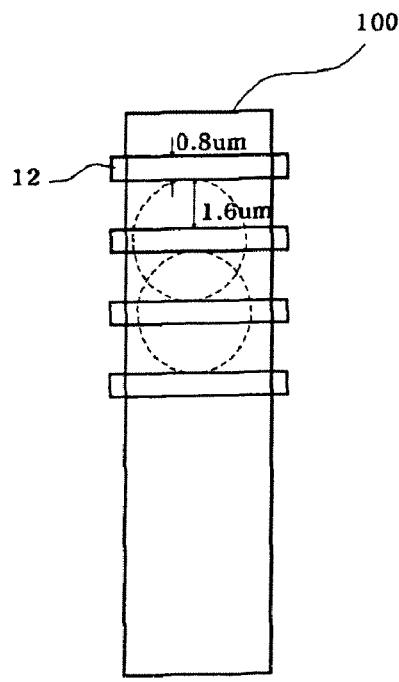
FIG. 1 is a layout illustrating conventional fuses of a semiconductor memory device.
Figure 2:
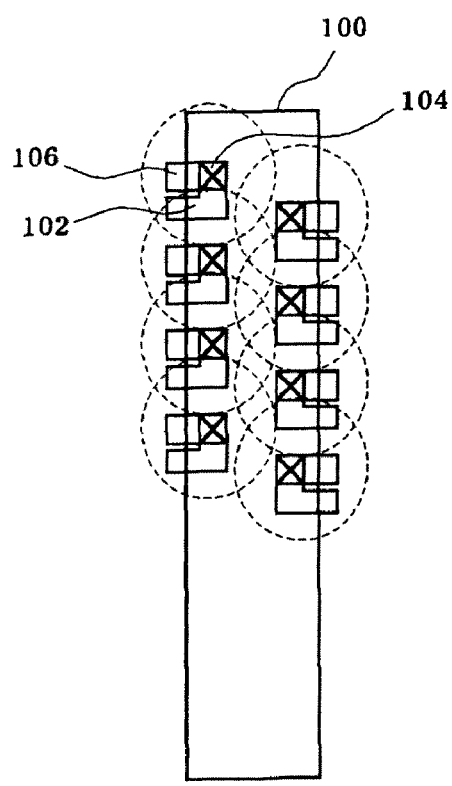
FIG. 2 is a layout illustrating a first example of fuses of a semiconductor memory device.

FIG. 2 is a layout illustrating an example of fuses of a semiconductor memory device.

Referring to FIG. 2, the fuse, in the form of a multilayer interconnection, includes a lower conductive film 102 formed on an interlayer insulating film, which is a lower structure 100 of a semiconductor substrate, an upper conductive film 106 spaced apart upward from the lower conductive film 102 so as to define a predetermined vertical space there between, and a contact electrode 104 vertically connecting the lower and upper conductive films 102 and 106 to each other. Here, the lower and upper conductive films 102 and 106 are made of metal, and the vertical contact electrode 104, connecting the lower and upper conductive films 102 and 106, forms a fuse body.

In the example of FIG. 2, in order to provide a laser beam irradiation space for a repair process, the upper conductive film 106 has a horizontal line form, and the lower conductive film 102 has an L-shaped or a 90°-rotated L-shaped form. The reason why the lower conductive film 102 is formed to have the L-shaped or a 90°-rotated L-shaped form, rather than the horizontal line form, is for defining a predetermined space between the lower conductive film 102 and the contact electrode 104, in order to prevent the lower conductive film 102 from being cut by a laser beam.

In the example of FIG. 2, a plurality of fuses are formed and are asymmetrically arranged in two rows, providing a sufficient laser beam irradiation space for the repair process.

With such a configuration, a semiconductor memory device or other semiconductor device is provided using a repair fuse with the plurality of highly integrated fuses having vertical contact electrodes. When it is desired to reduce the entire size of the semiconductor device for achieving the high integration density thereof, a region occupied by the fuses, namely, a fuse box is correspondingly reduced. In connection with this, a significant reduction in the overall size of the fuses is enabled through the use of the vertical contact electrode 104. Thereby, the fuses or fuse box can be integrated even in a reduced narrow area while ensuring a sufficient layout stability of the fuses, resulting in an improvement in the productivity of the semiconductor device.

Figure 3A:
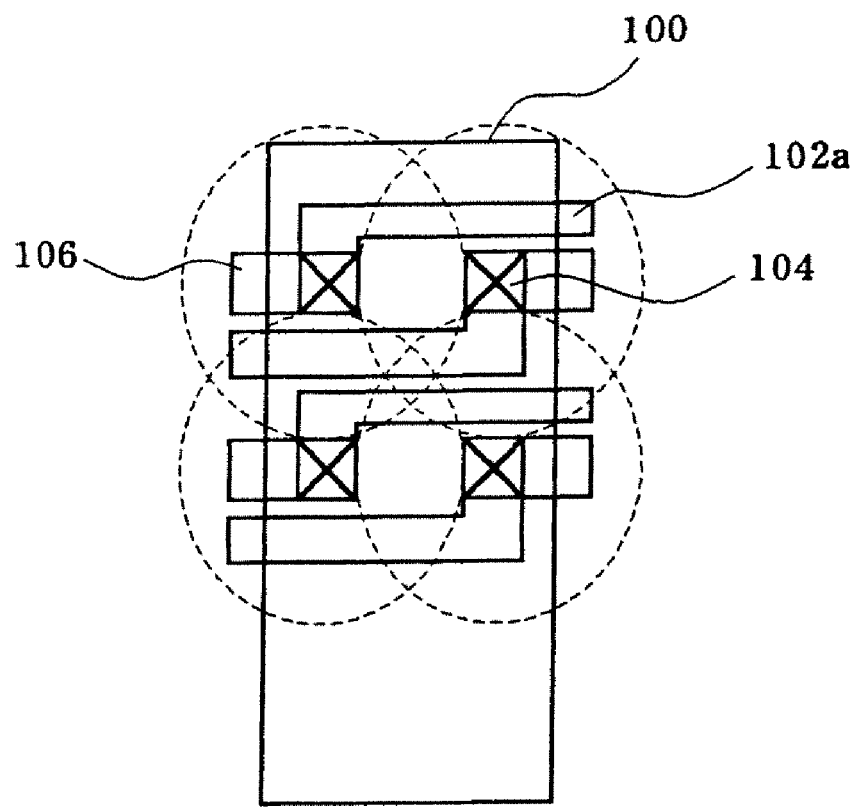
FIGS. 3a and 3b are layouts illustrating a second example of fuses of the semiconductor memory device.
Figure 3B:
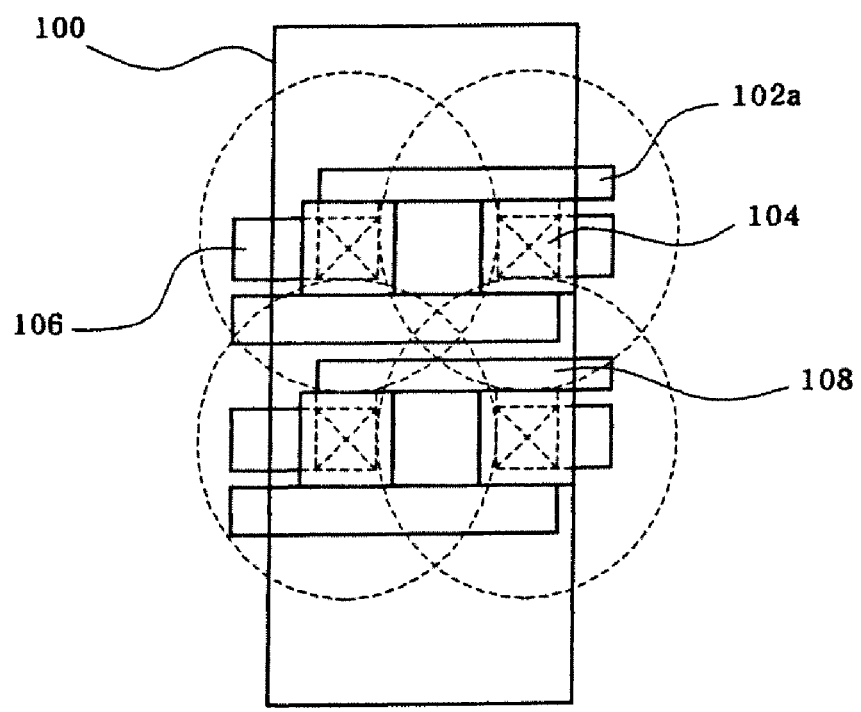

FIGS. 3a and 3b are layouts illustrating a second example of fuses of the semiconductor memory device.

Referring to FIG. 3a, a lower conductive film 102a, connected to the vertical contact electrode 104 has a clockwise or counterclockwise 90°-rotated L-shaped form. Referring to FIG. 3b, the fuse may further include a metal pad 108, which is connected to the upper metal film 106 by means of contact electrodes (not shown). In this case, the metal pad 108 is larger than the contact electrode 104 as the fuse body.

In the example of FIGS. 3a and 3b, the plurality of fuses is symmetrically arranged in two rows.

Figure 4A:
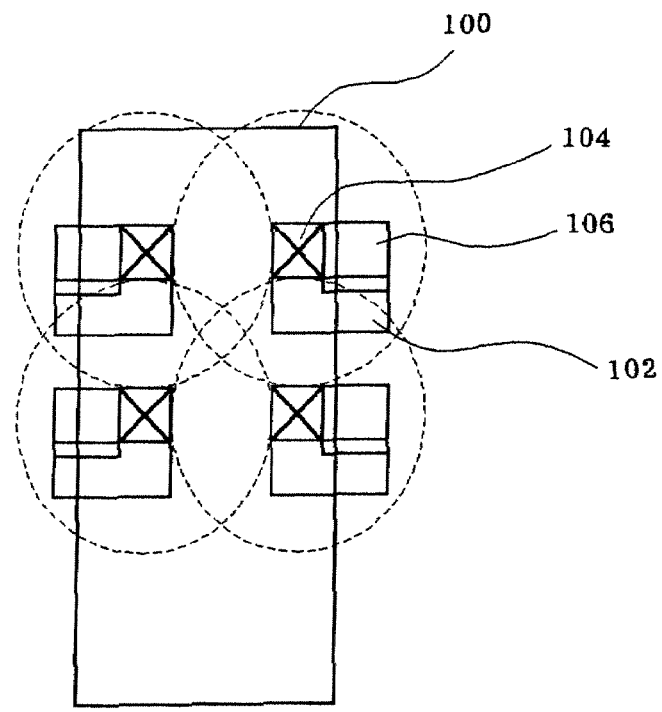
FIGS. 4a and 4b are layouts illustrating a third example of fuses of the semiconductor memory device.
Figure 4B:
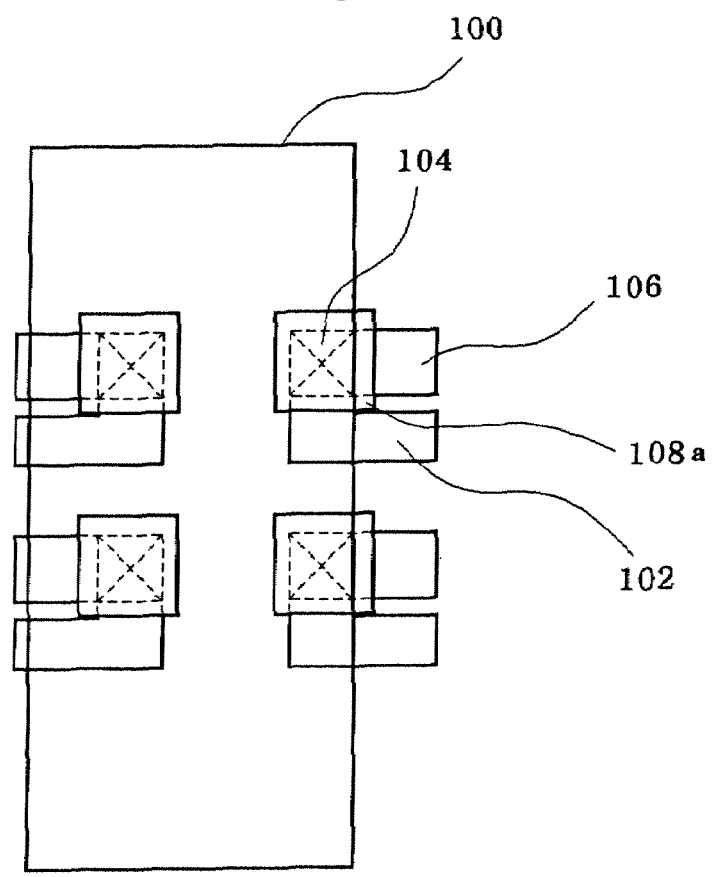

FIGS. 4a and 4b are layouts illustrating a third example of fuses of the semiconductor memory device.

Referring to FIG. 4a, the plurality of fuses has the same arrangement as that of FIG. 2 except for the fact that they are symmetrically arranged. Referring to FIG. 4b, a metal pad 108a can be added to one of the fuses symmetrically arranged in two rows. Similarly, the metal pad 108a is connected to the upper metal film 106 by means of contact electrodes (not shown).

In the examples shown in FIGS. 3b and 4b, even if the size of the contact electrode 104 is invisible to the naked eye, the metal pad 108; 108a added to the fuse enables the contact electrode 104 to be easily confirmed with the naked eye in the repair process.

Figure 5A:
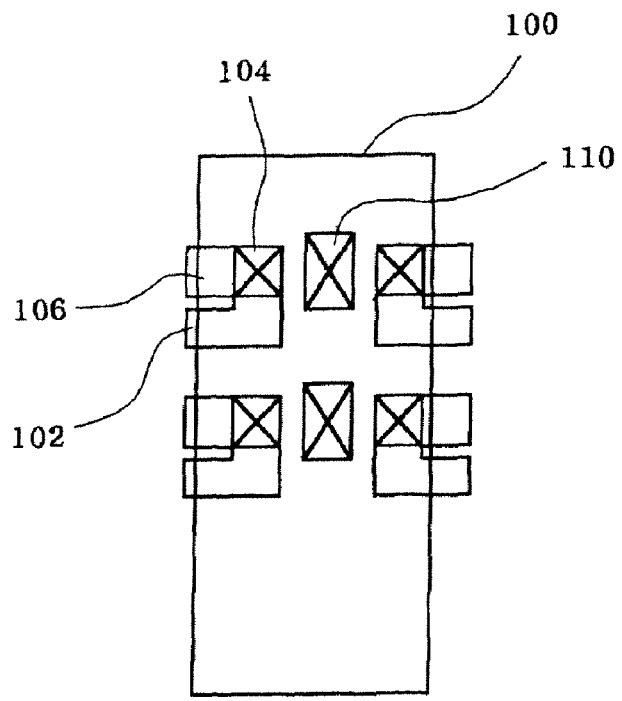
FIGS. 5a and 5b are layouts illustrating a fourth example of fuses and contact electrodes of the semiconductor memory device.
Figure 5B:
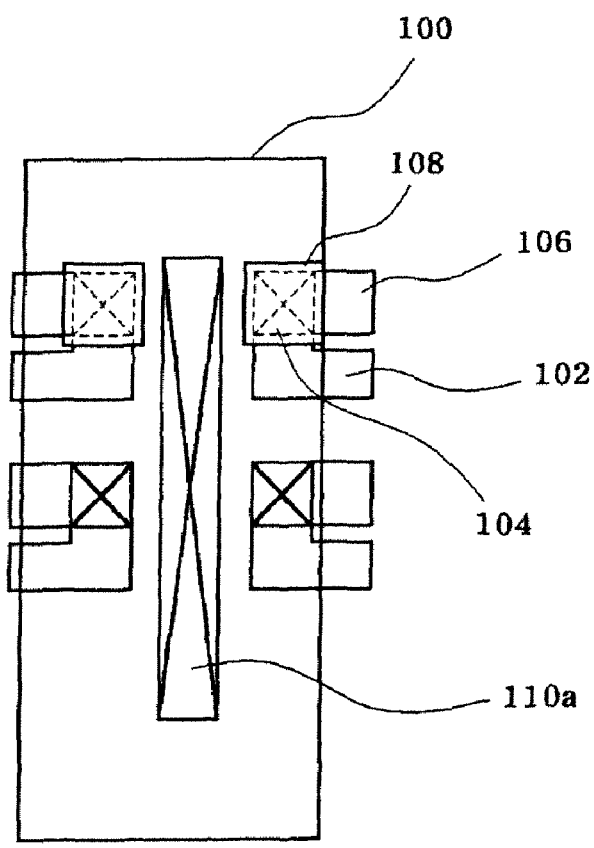

FIGS. 5a and 5b are layouts illustrating a fourth example of the fuses and additional contact electrodes of the semiconductor memory device.

Referring to FIG. 5a, the fourth example is similar to the example of FIGS. 4a and 4b except that two or more contact electrodes 110, which are spaced apart from each other, are added in the space defined between the two rows of the fuses. In this case, each of the contact electrodes 110 has a size equal to or similar to that of the contact electrode 104 used as the fuse body. Alternatively, referring to FIG. 5b, a single contact electrode 110a may be formed in the space defined between the two rows of the fuses. The single contact electrode 110a has a size equal to the size of the two or more fuses.

As a result of adding the two or more contact electrodes 110 spaced apart from each other or the single contact electrode 110a in the space between the two rows of the fuses 104, the fourth example can prevent corrosion of some fuses aligned in a row from having a negative effect upon other fuses aligned in the other row.

Figure 6:
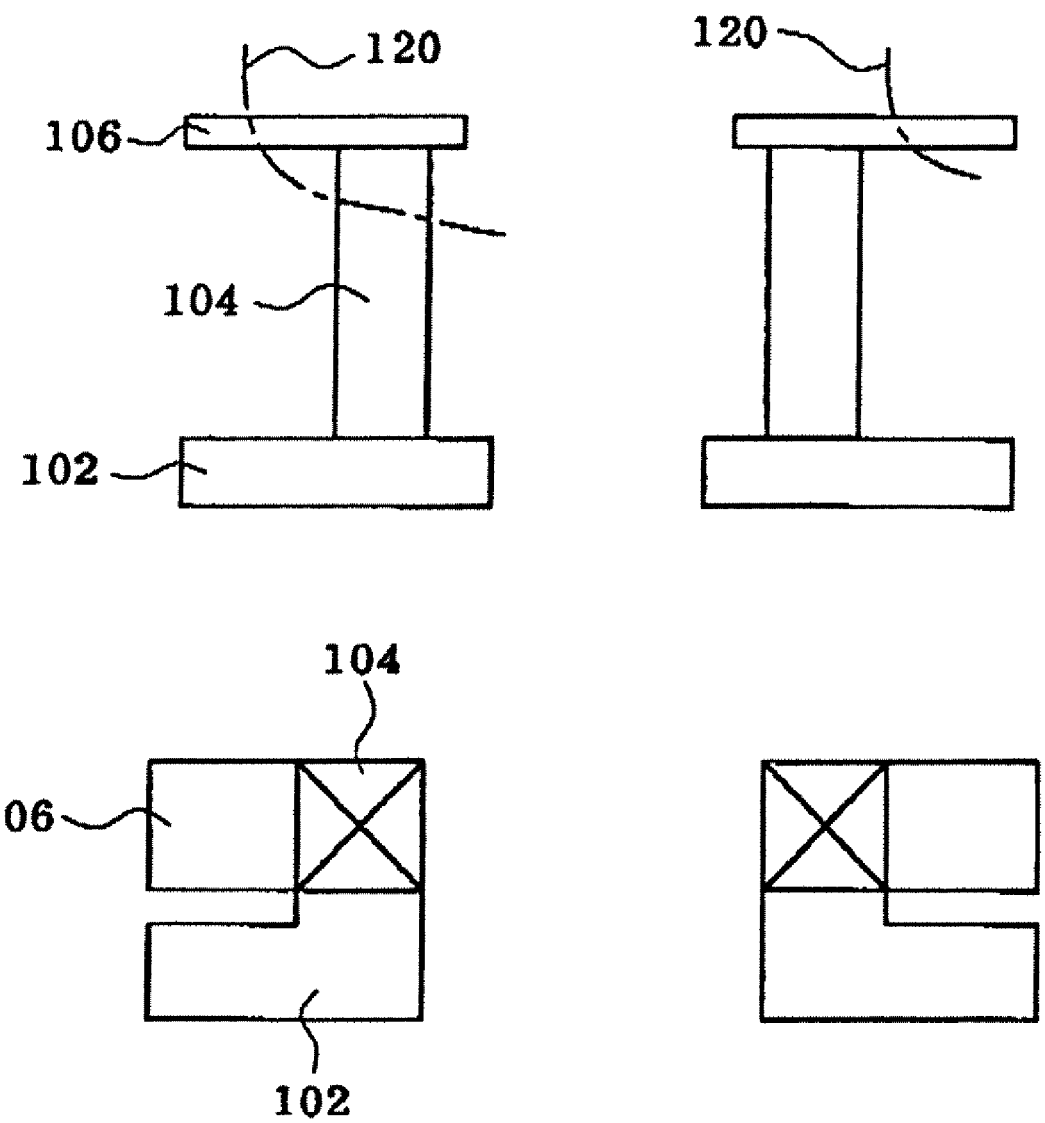
FIG. 6 is a view depicting a first example of a repair process for cutting the fuse using a laser beam.

FIG. 6 is a view depicting an example of the repair process for cutting the fuse using the laser beam.

Referring to FIG. 6, in the repair process, the contact electrode 104 of the fuse, vertically connecting the lower and upper conductive films 102 and 106, is cut by the laser beam. In this case, the upper conductive film 106 of the fuse is cut by the laser beam, along with the contact electrode 104 or alone.

Figure 7:
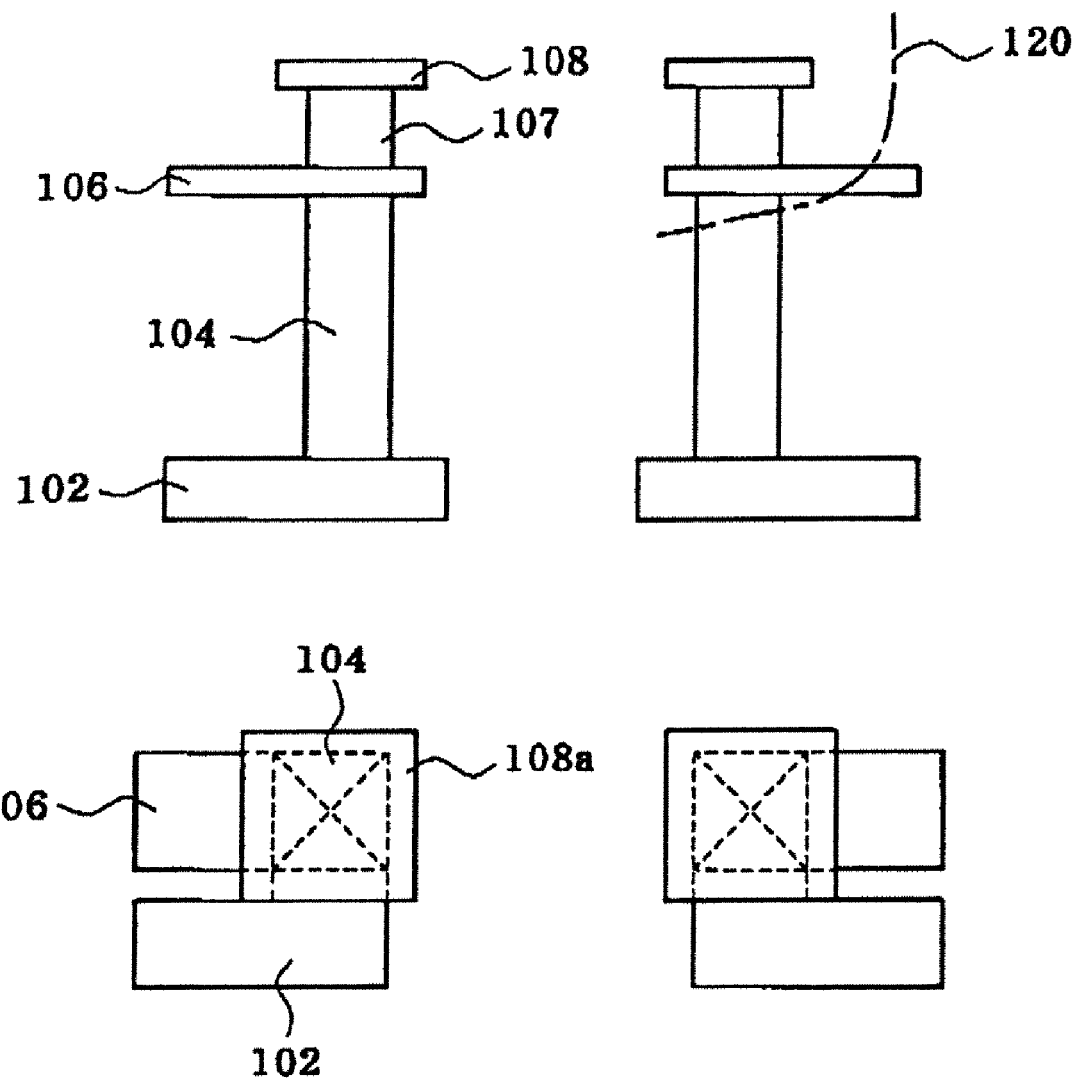
FIG. 7 is a view depicting a second example of a repair process for cutting the fuse using the laser beam, in a state wherein a pad is added to the fuse.

FIG. 7 is a view depicting a second example of a repair process for cutting the fuse using the laser beam, in a state wherein the metal pad 108a is added to the fuse.

Referring to FIG. 7, in the repair process related to the fuse having the metal pad 108a for facilitating confirmation of the fuse 104 with the naked eye, the contact electrode 104 and the upper conductive film 106 of the fuse, as the subject of repair, are cut by the laser beam as shown by the dash-dotted line 120. A contact pad 107 connects the metal pad 108a to the upper conductive film 106.

Figure 8:
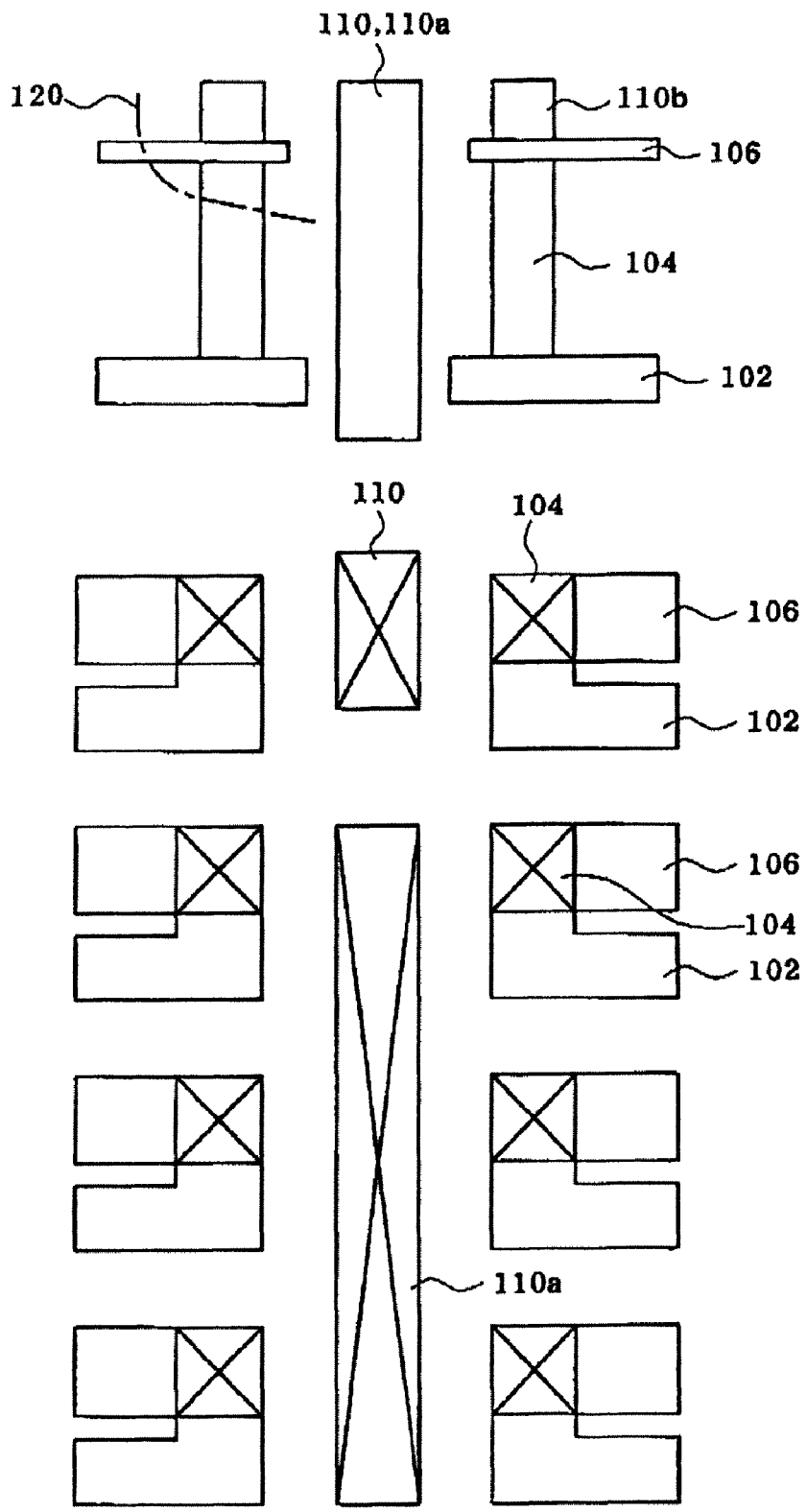
FIG. 8 is a view depicting a third example of a repair process for cutting the fuse using the laser beam in a state wherein a contact electrode is interposed between the adjacent fuses.

FIG. 8 is a view depicting a third example repair process for cutting the fuse using the laser beam, in a state wherein the electrode(s) 110; 110a is added in the space defined between the two rows of the fuses.

Referring to FIG. 8, in the repair process related to the fuse having the contact electrode(s) 110; 110a located in the space between the two rows of the fuses, the contact electrode 104 and the upper conductive film 106 of the fuse, as the subject of repair, are cut by the laser beam as shown by the dash-dotted line 120. In this case, it is necessary to take precautions so as not to cut the contact electrode(s) 110; 110a by the laser beam. A contact pad 107 is connected with the upper conductive film 106.

As apparent from the above description, this disclosure provides a fuse of a semiconductor memory device wherein, in the manufacture of a multilayer interconnection of the semiconductor memory device, a contact electrode, which vertically connects upper and lower interconnections to each other, is formed as a fuse body, thereby being capable of achieving a stable minimization of the fuse and the distance between adjacent fuses in consideration of a laser beam irradiation region for the high integration of the semiconductor memory device, and a repair process for the same.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed:

1. A repair process for a fuse of a semiconductor memory device comprising:
   providing a fuse comprising a lower conductive film of a multilayer interconnection formed on a lower structure of a semiconductor substrate, an upper conductive film of the multilayer interconnection spaced apart upward from the lower conductive film to define a predetermined vertical space therebetween and comprising a form not coinciding with that of the upper conductive film, and a first fuse body vertically connecting the upper and lower conductive films to each other; and
   cutting the first fuse body of the fuse by providing a laser beam on the first fuse body,
   wherein a plurality of the fuses, each comprising the upper and lower conductive films and the first fuse body, are arranged in plural rows, and
   wherein the fuse further comprises a second fuse body installed between the plural rows of the fuses, and during the cutting one of the first fuse bodies by the laser beam, the second fuse body protects other first fuse bodies from being damaged.

2. The process according to claim 1, wherein the plurality of the fuses are asymmetrically arranged in plural rows.

3. The process according to claim 1, wherein the plurality of the fuses are symmetrically arranged in plural rows.

* * * * *